(12) United States Patent
Song et al.

(10) Patent No.: US 12,210,239 B2
(45) Date of Patent: Jan. 28, 2025

(54) COLOR CONVERSION PANEL AND DISPLAY DEVICE INCLUDING THE SAME

(71) Applicant: Samsung Display Co., Ltd., Yongin-si (KR)

(72) Inventors: Jun Ho Song, Seongnam-si (KR); Sung Man Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 704 days.

(21) Appl. No.: 15/828,574

(22) Filed: Dec. 1, 2017

(65) Prior Publication Data

US 2018/0210282 A1 Jul. 26, 2018

(30) Foreign Application Priority Data

Jan. 23, 2017 (KR) .................. 10-2017-0010656

(51) Int. Cl.
*G02F 1/1335* (2006.01)
*G02B 5/20* (2006.01)
(Continued)

(52) U.S. Cl.
CPC ......... *G02F 1/133514* (2013.01); *G02B 5/20* (2013.01); *G02B 5/22* (2013.01);
(Continued)

(58) Field of Classification Search
CPC ......... G02F 1/133514; G02F 1/133536; G02F 1/13362; G02F 1/133509; G02F 1/133512;
(Continued)

(56) References Cited

U.S. PATENT DOCUMENTS 6,266,113 B1 7/2001 Yamazaki et al.
6,642,977 B2 * 11/2003 Kotchick .......... G02F 1/133528
349/96

(Continued)

FOREIGN PATENT DOCUMENTS

CN 104280935 A 1/2015
CN 104344287 A 2/2015
(Continued)

OTHER PUBLICATIONS

3M Optical Systems, "Vikuiti, Dual Brightness Enhancement Film (DBEF)", http://www.opticalfiltersusa.com/includes/downloads/3m/DBEF_E_DS_7516882.pdf, available 2008, accessed on Dec. 8, 2020 (Year: 2008).*

(Continued)

*Primary Examiner* — Stephone B Allen
*Assistant Examiner* — Adam W Booher
(74) *Attorney, Agent, or Firm* — CANTOR COLBURN LLP

(57) ABSTRACT

A color conversion panel includes: a substrate defining a first surface through which external light is incident to the substrate and a second surface which is opposite to the first surface and through which the external light exits the substrate; a reflective polarization film at the first surface of the substrate; and at the second surface of the substrate, a first color conversion layer and a second color conversion layer each on the second surface of the substrate; a polarization layer on the first color conversion layer and the second color conversion layer; and a planarization layer between the polarization layer and the first color conversion layer and between the polarization layer and the second color conversion layer.

27 Claims, 10 Drawing Sheets

(51) Int. Cl.
 G02B 5/22 (2006.01)
 H01L 33/50 (2010.01)
(52) U.S. Cl.
 CPC ...... G02F 1/133536 (2013.01); H01L 33/505 (2013.01); *G02F 1/133548* (2021.01); *G02F 1/133614* (2021.01)
(58) Field of Classification Search
 CPC ........ G02F 2001/133548; G02F 2001/133614; G02B 5/20; G02B 5/22; G02B 5/201; G02B 5/206; H01L 33/505; H01L 33/50; H01L 33/508
 See application file for complete search history.

(56) References Cited

U.S. PATENT DOCUMENTS

| | | | |
|---|---|---|---|
| 6,864,627 B2 | 3/2005 | Komoto et al. | |
| 7,956,959 B2 | 6/2011 | An et al. | |
| 8,077,275 B2 | 12/2011 | Yang et al. | |
| 8,294,848 B2 | 10/2012 | Cho et al. | |
| 8,687,150 B2 | 4/2014 | Park et al. | |
| 8,796,704 B2 * | 8/2014 | Hatta | H01L 27/3213 257/59 |
| 10,423,031 B2 | 9/2019 | Yamamoto et al. | |
| 10,698,263 B2 | 6/2020 | Yamamoto et al. | |
| 2006/0221276 A1* | 10/2006 | Masumoto | G02F 1/133514 349/114 |
| 2010/0053524 A1* | 3/2010 | An | G02F 1/133504 349/122 |
| 2010/0079704 A1* | 4/2010 | Cho | G02F 1/133617 349/71 |
| 2013/0335799 A1* | 12/2013 | Yoon | G02F 1/133553 359/227 |
| 2016/0062183 A1 | 3/2016 | Sung et al. | |
| 2016/0091757 A1* | 3/2016 | Miki | G02F 1/133617 349/42 |
| 2016/0177181 A1* | 6/2016 | Liu | C09K 11/883 362/606 |
| 2016/0291218 A1* | 10/2016 | Asaoka | G02B 5/0268 |
| 2016/0313599 A1 | 10/2016 | Kwon et al. | |
| 2017/0003548 A1* | 1/2017 | Mizunuma | G02F 1/133617 |
| 2017/0133357 A1* | 5/2017 | Kuo | H01L 25/167 |
| 2018/0045395 A1* | 2/2018 | Kamada | F21S 2/00 |
| 2018/0231843 A1* | 8/2018 | Park | G02F 1/133617 |
| 2020/0285116 A1 | 9/2020 | Yamamoto et al. | |

FOREIGN PATENT DOCUMENTS

| | | |
|---|---|---|
| JP | 2009-116050 A | 5/2009 |
| JP | 2015050059 A | 3/2015 |
| JP | 2015064391 A | 4/2015 |
| KR | 20090126729 A | 12/2009 |
| KR | 20100026029 A | 3/2010 |
| KR | 20100111103 A | 10/2010 |
| KR | 20110061899 A | 6/2011 |
| KR | 1020120065748 A | 6/2012 |
| KR | 101338149 B1 | 12/2013 |
| KR | 101463024 B1 | 11/2014 |

OTHER PUBLICATIONS

Hidden Television, https://www.hiddentelevision.com, available at least as of 2007 (per Internet Archive, attached), accessed online May 11, 2023. (Year: 2007).*
European Search Report for European Patent Application No. 18152799.5 dated Jun. 11, 2018.
Chinese Office Action for Chinese Patent Application No. 201810063162.8 dated Sep. 24, 2021.

* cited by examiner

COLOR CONVERSION PANEL AND DISPLAY DEVICE INCLUDING THE SAME

This application claims priority to Korean Patent Application No. 10-2017-0010656 filed on Jan. 23, 2017, and all the benefits accruing therefrom under 35 U.S.C. § 119, the contents of which in their entirety are herein incorporated by reference.

BACKGROUND (a) Field

The present disclosure relates to a color conversion panel and a display device including the same.

(b) Description of the Related Art

A liquid crystal display used as a display device includes two electrodes forming an electric field, a liquid crystal layer, a color filter, a polarizer, and the like. Light generated from a light source of the display device reaches viewers through the liquid crystal layer, the color filter and the polarizer. In this case, light loss is generated in the polarizer and the color filter. The light loss is also generated in other display devices using a color filter such as an organic light emitting diode display as well as the liquid crystal display.

SUMMARY

Exemplary embodiments of the invention provide a color conversion panel and a display device including the same for reducing or effectively preventing a contrast ratio deterioration by external light reflection and for improving color reproducibility.

A color conversion panel according to an exemplary embodiment of the invention includes: a substrate defining a first surface through which external light is incident to the substrate and a second surface which is opposite to the first surface and through which the external light exits the substrate; a reflective polarization film disposed at the first surface of the substrate; and at the second surface of the substrate, a first color conversion layer and a second color conversion layer each disposed on the second surface of the substrate; a polarization layer disposed on the first color conversion layer and the second color conversion layer; and a planarization layer disposed between the polarization layer and the first color conversion layer and between the polarization layer and the second color conversion layer.

The polarization layer may include a polarization pattern including a metal material, and an insulating layer covering the polarization pattern.

The reflective polarization film may be a dual brightness enhancement film ("DBEF").

The first color conversion layer and the second color conversion layer may be spaced apart from each other along the second surface of the substrate, and the color conversion panel may further include a first light blocking member disposed between the first color conversion layer and the second color conversion layer.

A width of the first light blocking member in a cross-section thereof may gradually increase along a first direction toward the planarization layer from the second surface of the substrate.

The planarization layer may be further disposed between the polarization layer and the first light blocking member. A first thickness of the planarization layer may be defined at the first color conversion layer or the second color conversion layer, and a second thickness of the planarization layer may be defined at the first light blocking member, the first and second thicknesses may be the same as each other or the second thickness may be larger than the first thickness, and the second thickness being larger than the first thickness may define a difference between the second thickness and the first thickness less than about 1 micrometer.

The color conversion panel may further include a second light blocking member disposed between the substrate and the first light blocking member, and a width of the second light blocking in a cross-section thereof member may gradually decrease along the first direction.

The first light blocking member and the second light blocking member may be in contact with each other.

The second light blocking member may include a dual layer of an organic layer and a transflective layer.

The color conversion panel may further include a capping layer disposed between the first color conversion layer and the first light blocking member and between the second color conversion layer and the first light blocking member.

The color conversion panel may further include a light filter layer disposed between the capping layer and the planarization layer.

The color conversion panel may further include an outlet penetrating the polarization layer, the outlet exposing the planarization layer.

The first color conversion layer and the second color conversion layer may include at least two light color conversion members representing different colors from each other, respectively. The color conversion panel may further include with the first and second color conversion layers each including the at least two light color conversion members: a first color filter disposed between the substrate and the first color conversion layer; and a second color filter disposed between the substrate and the second color conversion layer.

The first color conversion layer and the second color conversion layer may be spaced apart from each other along the second surface of the substrate. The color conversion panel may further include at the second surface of the substrate, a transmission layer adjacent to the first and second color conversion layers along the second surface of the substrate.

A display device according to an exemplary embodiment of the invention includes: a display panel which displays an image with light; a color conversion panel which receives the light from the display panel; and an optical transmittance layer disposed between the display panel and the color conversion panel. The color conversion panel includes: a substrate defining a first surface through which external light external to the display device is incident to the substrate and a second surface opposite to the first surface and through which the external light exits the substrate; a reflective polarization film disposed at the first surface of the substrate; and at the second surface of the substrate, a first color conversion layer and a second color conversion layer each disposed on the second surface of the substrate; a planarization layer disposed between the first color conversion layer and the optical transmittance layer and between the second color conversion layer and the optical transmittance layer; and a polarization layer disposed between the planarization layer and the optical transmittance layer.

The first color conversion layer and the second color conversion layer may be spaced apart from each other along the second surface of the substrate. The color conversion panel may further include a transmission layer disposed adjacent to the first and second color conversion layers along the second surface of the substrate.

The polarization layer may include a polarization pattern including a metal material, and an insulating layer covering the polarization pattern.

The reflective polarization film may be a dual brightness enhancement film ("DBEF").

The color conversion panel which receives the light from the display panel may be disposed at one side of the display panel. The color conversion panel may further include a light source unit disposed at a side opposite to that of the color conversion panel to provide the light to the display panel.

The first color conversion layer and the second color conversion layer are spaced apart from each other along the second surface of the substrate. The color conversion panel may include at the second surface of the substrate, a first light blocking member disposed between the first color conversion layer and the second color conversion layer spaced apart from each other.

A width of the first light blocking member in a cross-section thereof may gradually increase along a first direction from the second surface of the substrate toward the planarization layer.

The planarization layer may be further disposed between the polarization layer and the first light blocking member. A first thickness of the planarization layer may be defined at the first color conversion layer or the second color conversion layer, and a second thickness of the planarization layer may be defined at the first light blocking member, the first and second thicknesses may be the same as each other or the second thickness may be larger than the first thickness, and the second thickness being larger than the first thickness may define a difference between the second thickness and the first thickness less than about 1 micrometer.

The color conversion panel may include a second light blocking member disposed between the substrate and the first light blocking member, and a width of the second light blocking member in a cross-section thereof may gradually decrease along the first direction from the second surface of the substrate toward the planarization layer.

The first light blocking member and the second light blocking member may contact each other.

According to exemplary embodiments, while controlling the influence of the external light on the color conversion layer by the reflective polarization film, a mirror display may be realized by reversely using the effect due to the external light reflection.

Also, by realizing the colors of the color conversion layer by only a light source unit of the display device and by excluding the external light, the color reproducibility may increase.

Further, by forming the light blocking member functioning as the planarization layer, the polarization function of an in-cell polarizer may be improved.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
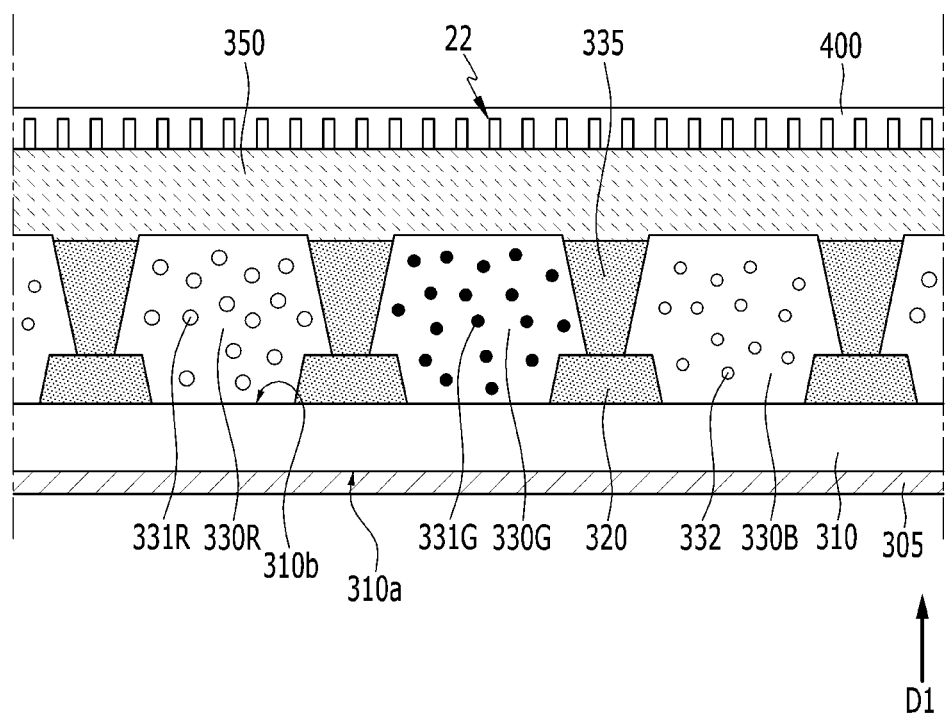
FIG. 1 is a cross-sectional view showing a color conversion panel according to an exemplary embodiment of the present disclosure.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In order to clearly explain the invention, portions that are not directly related to the invention are omitted, and the same reference numerals are attached to the same or similar constituent elements through the entire specification.

In addition, the size and thickness of each configuration shown in the drawings are arbitrarily shown for better understanding and ease of description, but the invention is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being related to another elements such as being "on" another element, it can be directly on the other element or intervening elements may also be present. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Further, in the specification, the word "on" means positioning on or below the object portion, but does not essentially mean positioning on the upper side of the object portion based on a gravity direction. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "a plane structure" means a case where a target portion is viewed from above, and the phrase "in a sectional view" or "a cross-sectional structure" means a case where a cross-section taken by vertically cutting a target portion is viewed from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

To realize a display device of relatively high efficiency while reducing light loss via a polarizer and a color filter, a display device including a color conversion panel has been researched.

FIG. 1 is a cross-sectional view showing a color conversion panel according to an exemplary embodiment of the present disclosure.

Referring to FIG. 1, a color conversion panel includes a substrate 310 having a first surface 310a and a second surface 310b which is disposed at an opposite side of the first surface 310a. A reflective polarization film 305 having a mirror function is disposed at the first surface 310a of the substrate 310. The reflective polarization film 305 may be a dual brightness enhancement film ("DBEF"). The dual brightness enhancement film has two axes, one of which may be a transmissive axis and the other of which may be a reflective axis.

The dual brightness enhancement film as the reflective polarization film 305 may be a multi-layered type structure of optical film, such as that manufactured and sold by the 3M Company, but not limited thereto. The multi-layered type structure of optical film may be a multi-layered optical film in which at least two kinds of polymer layers are mutually arranged side-by-side with several hundred layers thereof to completely match a refractive index of each dielectric main axis and to differentiate the refractive indices of other directions. However, the optical film is not limited thereto, and a film selectively transmitting or reflecting the light depending on polarization components of external light incident thereto and having the mirror function may be applied as the reflective polarization film 305.

The transmissive axis of the dual brightness enhancement film may transmit a P wave of the external light incident thereto, and the reflective axis of the dual brightness enhancement film may reflect an S wave of the external light incident thereto. Here, the external light enters the first surface 310a of the substrate 310 and exits from the second surface 310b of the substrate 310.

A first color conversion layer 330R and a second color conversion layer 330G are disposed at the second surface 310b of the substrate 310. Each of the first color conversion layer 330R and the second color conversion layer 330G may be disposed between light blocking members that are adjacent to each other along the second surface 310b of the substrate 310. A transmission layer 330B is disposed at the second surface 310b of the substrate 310. The first color conversion layer 330R and the second color conversion layer 330G are not disposed at the portion of the second surface 310b of the substrate 310 at which the transmission layer 330B is disposed.

A light blocking member is disposed between the transmission layer 330B and the first color conversion layer 330R and between the transmission layer 330B and the second color conversion layer 330G. In the present exemplary embodiment, the light blocking member may include a first light blocking member (portion) 335 and a second light blocking member (portion) 320.

In FIG. 1, heights of the first color conversion layer 330R, the second color conversion layer 330G, and the transmission layer 330B are the same, however the heights thereof may be different from one another. The heights may be respectively taken from a common reference surface, such as the second surface 310b of the substrate 310, to extend in a thickness direction of the color conversion panel (vertical in FIG. 1). The heights may be maximum heights of a respective feature taken from the common reference surface.

A conventional dual brightness enhancement film is mounted as a sheet type inside a backlight unit used as a light generating/providing member of a display device and is used to improve brightness of the backlight unit in a display panel of the display device such as a liquid crystal display ("LCD").

However, in the present exemplary embodiment, as the dual brightness enhancement film is formed at one surface (e.g., external light incident surface) of the substrate 310 of the color conversion panel, application of the external light to a color conversion layer such as including a quantum dot disposed or formed at surface of the substrate 310 opposite to the one surface thereof (e.g., exit surface) may be reduced or effectively prevented, and light included in the color conversion layer and used for displaying an image is emitted. Therefore, in a display device including such dual brightness enhancement film, an increase of the black luminance may be reduced, and decrease of the contrast ratio may be reduced or effectively to improve a display quality characteristic of the display device.

Also, by reversely using the external light reflection, the external light may be used for a mirror display when the display device including the color conversion panel according to the present exemplary embodiment is not driven. Also, introducing a relatively expensive compensation film in which a ¼λ, film and a transflective layer are combined to prevent the external light reflection may be omitted, such that a cost of a display device may be reduced.

The first light blocking member 335 may fill a valley formed between the first color conversion layer 330R and the second color conversion layer 330G adjacent to each other, between the first color conversion layer 330R and the transmission layer 330B, and between the second color conversion layer 330G and the transmission layer 330B. In this case, a cross-section dimension (e.g., width) of the first light blocking member 335 may be gradually increased along a first direction D1 (e.g., thickness direction). The width dimension may be taken in a third direction (horizontal in FIG. 1) parallel to the substrate 310, such as to the second surface 310b thereof. The width dimension may also be taken in a fourth direction which crosses the first and third directions and is parallel to the substrate 310, such as to the second surface 310b thereof.

The second light blocking member 320 may be disposed between the first light blocking member 335 and the substrate 310 in the first direction D1. In this case, the cross-section dimension (e.g., width) of the second light blocking member 320 may be gradually decreased along the first direction D1 (e.g., thickness direction). Similar to that discussed for the first light blocking member 335, the width dimension may be taken in the third and fourth directions which and parallel to the substrate 310, such as to the second surface 310b thereof.

An edge of the first color conversion layer 330R, an edge of the second color conversion layer 330G and an edge of the transmission layer 330B may cover a portion of an upper surface of the second light blocking member 320. A width of the upper surface of the second light blocking member 320 may be larger than a width of a lower surface of the first light blocking member 335. The first light blocking member 335 and the second light blocking member 320 may be in contact with each other.

In this way, a collective light blocking member including stacked portions 335 and 320 may define regions where the first color conversion layer 330R, the second color conversion layer 330G and the transmission layer 330B adjacent to each other are disposed. The first color conversion layer 330R and the second color conversion layer 330G include a semiconductor nanoparticle such as a quantum dot and a phosphor. The first color conversion layer 330R includes a plurality of red quantum dots 331R, and the second color conversion layer 330G includes a plurality of green quantum dots 331G. Predetermined light incident to the first color conversion layer 330R may be converted into red light by the red quantum dots 331R to be emitted from the first color conversion layer 330R as the red light, and predetermined light incident to the second color conversion layer 330G may be converted into green light by the green quantum dots 331G to be emitted from the second color conversion layer 330G as the green light.

A planarization layer 350 may be disposed on the first color conversion layer 330R, the second color conversion layer 330G, the transmission layer 330B and the second light blocking member 320. The planarization layer 350 is commonly disposed relative to the above-described features. The planarization layer 350 functions to reduce a step generated when heights of upper surfaces of layers disposed under or formed before the planarization layer 350 are different.

A first thickness of a portion of the planarization layer 350 overlapping the first color conversion layer 330R or the second color conversion layer 330G, and a second thickness of a portion of the planarization layer 350 overlapping the first light blocking member 335 are substantially the same, or the second thickness may be larger than the first thickness. That is, the step between the upper surface of the first color conversion layer 330R or the upper surface of the second color conversion layer 330G, and the upper surface of the first light blocking member 335, may not be substantially generated. Or, the upper surface of the first light blocking member 335 may be lower than the upper surface of the first color conversion layer 330R or the upper surface of the second color conversion layer 330G to form a minimal step therebetween. In this case of the minimal step, a difference between the second thickness and the first thickness is smaller than about 1 micrometer. The color conversion panel includes such minimal step since the planarization characteristic of the planarization layer 350 is important for improvement of the polarization characteristic of a later-described polarization layer. The first and second thickness may be a maximum thickness of the planarization layer 350 respectively at a color conversion layer or a light blocking member.

In the present exemplary embodiment, as the first light blocking member 335 fills the valley between the adjacent first color conversion layer 330R and second color conversion layer 330G, between the adjacent first color conversion layer 330R and transmission layer 330B, and between the adjacent second color conversion layer 330G and transmission layer 330B, the planarization characteristic of the planarization layer 350 may be further improved.

In an exemplary embodiment of manufacturing the color conversion panel, to form the first light blocking member 335, a light blocking material is coated on the substrate 310 to cover the first color conversion layer 330R, the second color conversion layer 330G, and the transmission layer 330B and the valley therebetween.

The portions of the coated light blocking material overlapping the first color conversion layer 330R, the second color conversion layer 330G and the transmission layer 330B may be removed such as by only a developing process without a separate mask. Accordingly, the polarization characteristic described above may be realized by forming the first light blocking member 335 only in the valley respectively between the first color conversion layer 330R, the second color conversion layer 330G and the transmission layer 330B.

In the present exemplary embodiment, the first and second color conversion layers 330R and 330G and the transmission layer 330B may include a photosensitive resin.

The quantum dots included in the first and second color conversion layers 330R and 330G may be selected from a group II-VI compound, a group III-V compound, a group IV-VI compound, a group IV element, a group IV compound, and a combination thereof.

The group II-VI compound may be selected from: a two-element compound selected from a group of CdSe, CdTe, ZnS, ZnSe, ZnTe, ZnO, HgS, HgSe, HgTe, MgSe, MgS, and a combination thereof; a three-element compound selected from a group of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a four-element compound selected from a group of HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The group III-V compound may be selected from: a two-element compound selected from a group of GaN, GaP, GaAs, GaSb, AlN, AlP, AlAs, AlSb, InN, InP, InAs, InSb, and a combination thereof; a three-element compound selected from a group of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof; and a four-element compound selected from a group of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The group IV-VI compound may be selected from: a two-element compound selected from a group of SnS, SnSe, SnTe, PbS, PbSe, PbTe, and a combination thereof; a three-element compound selected from a group of SnSeS, SnSeTe, SnSTe, PbSeS, PbSeTe, PbSTe, SnPbS, SnPbSe, SnPbTe, and a combination thereof and a four-element compound selected from a group of SnPbSSe, SnPbSeTe, SnPbSTe, and a combination thereof.

The group IV element may be selected from a group of Si, Ge, and a combination thereof. The group IV compound may be a two-element compound selected from a group of SiC, SiGe, and a combination thereof.

In this case, the two-element compound, the three-element compound or the four-element compound may exist in particles at a uniform concentration, or in the same particle while being divided to have partially different concentration distributions.

Alternatively, the particles may have a core/shell structure where one quantum dot encloses another quantum dot. An interface between the core and the shell may have a concentration gradient such that a concentration of an element existing in the shell gradually decreases closer to a center of the interface.

The quantum dot may have a full width at half maximum ("FWHM") of the light-emitting wavelength spectrum that is the same as or less than about 45 nanometers (nm), such as the same as or less than about 40 nm or the same as or less than about 30 nm. In such ranges, color purity or color reproducibility may be improved. In addition, since light emitted via the quantum dot is emitted in all directions, a viewing angle of light may be improved.

Further, the quantum dot is not specifically limited to have shapes that are generally used in the technical field related to the invention. The quantum dot, may have a shape such as a nanoparticle having a spherical shape, a pyramidal shape, a multi-arm shape or a cubic shape, or may be a nanotube, a nanowire, a nanofiber, a planar nanoparticle, etc.

The transmission layer 330B may allow the predetermined incident light to pass therethrough, without changing a color thereof. The transmission layer 330B may transmit blue light. The transmission layer 330B may be a polymer material transmitting the blue light incident thereto. In an exemplary embodiment, for example, a display panel of a display device may receive light supplied from a light assembly (not shown) as a light source unit of the display device. The light assembly (not shown) may generate and provide the light to be incident to the color conversion panel in a direction opposite to the first direction D1. Where the light from the light assembly is blue light, the transmission layer 330B may correspond to a region of the display panel or display device which emits blue light. As such the transmission layer 330B does not include the separate quantum dots, and the predetermined incident blue light passes through the transmission layer 330B to be emitted as the blue light.

The transmission layer 330B may include a plurality of light scattering members 332. The scattering members 332 may scatter the light incident to the transmission layer 330B to increase an amount of light emitted from the transmission layer 330B or to make the front luminance and/or the lateral luminance be uniform. Although not shown, to further scatter the incident light, at least one layer among the first color conversion layer 330R and the second color conversion layer 330G may further include a scattering member described for the transmission layer 330B.

The scattering members 332, as an example, may include at least one selected from TiO2, Al2O3, and SiO2, but are not limited thereto.

The transmission layer 330B may further include a blue pigment. The above-described scattering member 332 reflects external light incident thereto such that the contrast ratio of a display device may be deteriorated. To compensate for this problem, the blue pigment may be added in the transmission layer 330B. The blue pigment may absorb at least one among the red light and the green light included in the external light which is incident to the transmission layer 330B.

A polarization layer may be disposed on the planarization layer 350. The polarization layer has a function of polarizing the light incident from the light source of a display device such as the light assembly (not shown). The polarization layer may use a coating polarizer, a wire grid polarizer, etc. In the present exemplary embodiment, to reflect the light generated from the color conversion layer and to emit the light in the direction opposite to the first direction D1, a reflective polarization layer may be used.

Referring to FIG. 1, the polarization layer includes a polarization pattern 22 collectively including a metal material (protrusion) provided in plurality, and an insulating layer 400 covering the polarization pattern 22. The polarization pattern 22 may have a plurality of linear lattice protruding structures including a metal such as aluminum. The polarization pattern 22 may reflect a polarization component parallel to the polarization pattern 22 and may transmit a polarization component perpendicular to the polarization pattern 22 among the light incident thereto.

The insulating layer 400 may insulate the polarization pattern 22 from an electrode (not shown) of the display device, such as when the electrode is formed thereon during a manufacturing process of the display device.

As described above, the color conversion panel according to the present exemplary embodiment includes the quantum dot having a self-emission characteristic and a relatively narrow emission spectrum, such that a relatively wide viewing angle and high color reproducibility of a display device including such color conversion panel may be realized.

Figure 2:
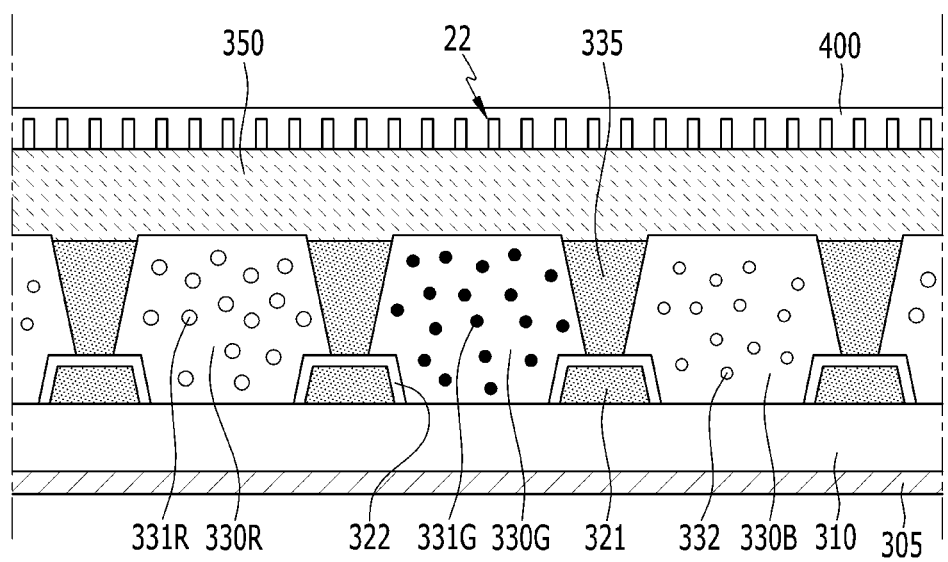
FIG. 2 is a cross-sectional view showing an exemplary variation of the color conversion panel described in FIG. 1.

FIG. 2 is a cross-sectional view showing an exemplary variation of the color conversion panel described in FIG. 1.

Referring to FIG. 2, the second light blocking member 320 described in FIG. 1 may collectively include an organic layer 321 and a transflective layer 322 which encloses the organic layer 321. The transflective layer 322 may have a triple layer structure of indium tin oxide ("ITO"), silver (Ag) and indium tin oxide ("ITO"). The organic layer 321 may be a light blocking member such as a black matrix. In an exemplary embodiment of manufacturing the color conversion panel, the organic layer 321 may be an alignment key to form other constituent elements among the manufacturing process while reducing or effectively preventing external light reflection. The transflective layer 322 may further improve the external light reflection prevention effect of the organic layer 321.

Since the transflective layer 322 has transflective characteristic, a portion of the light generated in the first color conversion layer 330R and the second color conversion layer 330G and emitted therefrom is transmitted and a remainder of the light generated in the first color conversion layer 330R and the second color conversion layer 330G and emitted therefrom is reflected to the substrate 310. Here, the transflective characteristic may mean that the reflectivity for incident light is between about 0.1% and about 70%, or between about 30% and about 50%

In an exemplary embodiment of manufacturing the color conversion panel, the organic layer 321 is formed by a photo process. In such process, material layers of indium tin oxide ("ITO"), silver (Ag) and indium tin oxide ("ITO") are sequentially coated on the substrate 310 to cover the organic layer 321 by selecting one among various deposition methods. An etching process may be performed to form portions of the transflective layer 322 spaced apart from each other to respectively cover the organic layer 321.

As an exemplary variation, the above-described second light blocking member may have a collective structure in which a metal and a transparent conductive layer are stacked, rather than the structure including the organic layer 321 and the transflective layer 322. Thereby, the light blocking member may have a structure in which titanium, indium zinc oxide, aluminum and indium tin oxide are sequentially stacked.

The contents described in FIG. 1 except for the above-described differences may all be applied to the exemplary embodiment of FIG. 2.

Figure 3:
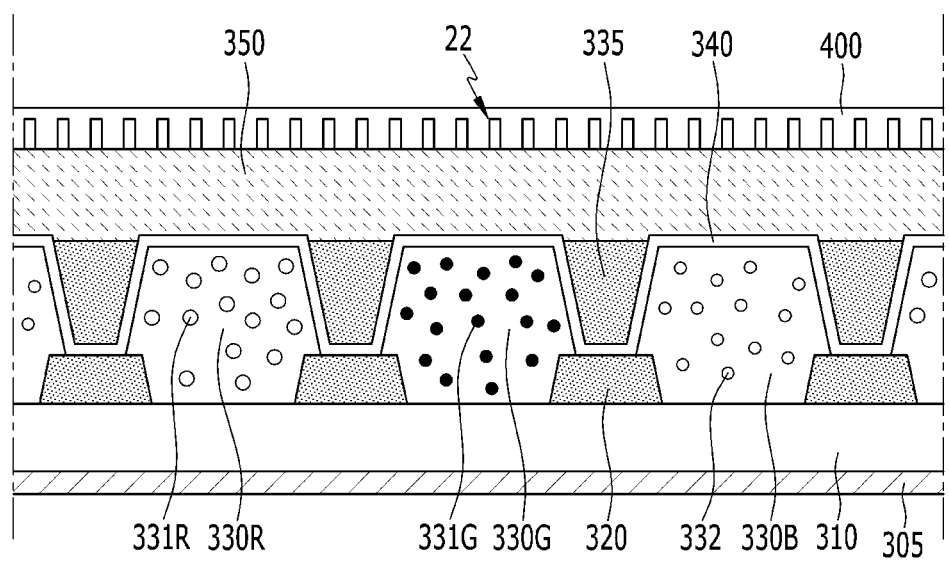
FIG. 3 is a cross-sectional view showing another exemplary variation of the color conversion panel described in FIG. 1.

FIG. 3 is a cross-sectional view showing another exemplary variation of the color conversion panel described in FIG. 1.

Referring to FIG. 3, portions of a capping layer 340 may be disposed between the first light blocking member 335 and the first color conversion layer 330R, between the first light blocking member 335 and the second color conversion layer 330G, and between the first light blocking member 335 and the transmission layer 330B. The portions of the capping layer 340 disposed between the members discussed above, may extend to be disposed between such members, and the overlying planarization layer 350. The capping layer 340 may be commonly disposed on the first color conversion layer 330R, the second light blocking member 320, the second color conversion layer 330G and the transmission layer 330B.

In an exemplary embodiment of manufacturing the color conversion panel, the capping layer 340 may be formed to reduce or effectively prevent the first and second color conversion layers 330R and 330G and the transmission layer 330B from being damaged by following processes after forming the first and second color conversion layer 330R and 330G and the transmission layer 330B. In detail, in the process after forming the first and second color conversion layers 330R and 330G, the quantum dots may be damaged or quenched by moisture and a relatively high temperature process in the first and second color conversion layers 330R and 330G, and the capping layer 340 may reduce or effectively prevent these problems.

The capping layer 340 may include an inorganic material, for example, a silicon nitride.

The contents described in FIG. 1 except for the above-described differences may all be applied to the exemplary embodiment of FIG. 3.

Figure 4:
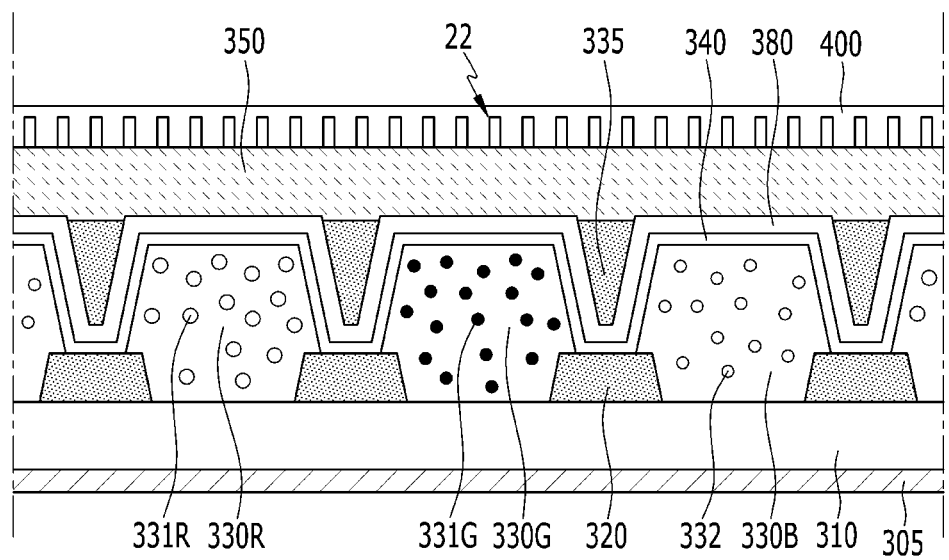
FIG. 4 is a cross-sectional view showing still another exemplary variation of the color conversion panel described in FIG. 1.

FIG. 4 is a cross-sectional view showing still another exemplary variation of the color conversion panel described in FIG. 1.

Referring to FIG. 4, portions of a light filtering layer 380 may be disposed between a capping layer 340 (refer to FIG. 3) and the first light blocking member 335. The light filtering layer 380 functions to increase photo-efficiency by reflecting the light generated in the first and second color conversion layer 330R and 330G. The portions of the light filtering layer 380 disposed between the members discussed above, may extend to be disposed between such members, and the overlying planarization layer 350. The light filtering layer 380 may be commonly disposed on the first color conversion layer 330R, the second light blocking member 320, the second color conversion layer 330G and the transmission layer 330B.

The light filtering layer 380 includes a plurality of layers. The plurality of layers may have a structure in which at least two or more layers having different refractive indexes from each other are alternately arranged in a direction substantially perpendicular to the substrate 310. In an exemplary embodiment, for example, the light filtering layer 380 may have a structure in which a silicon oxide (SiOx) layer and a silicon nitride (SiNy) layer are alternately arranged. Alternatively, as examples of a material having a relatively high refractive index, titanium oxide, tantalum oxide, hafnium oxide or zirconium oxide may be used, and as an example of a material having a relatively low refractive index, $SiCO_z$ may be used. In the $SiO_x$, $SiN_y$, and $SiCO_z$, x, y, and z as factors determining the chemical composition ratio may be controlled depending on process conditions when forming the layers.

In an exemplary embodiment, where the layer nearest to the capping layer 340 among the plurality of layers forming the light filtering layer 380 is formed of a silicon nitride layer, the capping layer 340 may be omitted.

A number of layers of the light filtering layer 380 in which the layers having the different refractive indexes from each other are alternately arranged may be about ten to twenty. However, as long as the light generated from the first and second color conversion layers 330R and 330G is reflected to increase the light efficiency, the number of layers may not be limited thereto.

Alternatively, the light filtering layer 380 may be disposed between the capping layer 340 and the planarization layer 350 and between the first light blocking member 335 and the planarization layer 350, and may be further disposed between the planarization layer 350 and the polarization layer such as a layer configured by the polarizing pattern 22. For a conventional color conversion panel, if the light filtering layer 380 is formed between the first and second color conversion layers 330R and 330G and the planarization layer 350, between the transmission layer 330B and the planarization layer 350, and between the capping layer 340 and the first light blocking member 335, the light filtering layer 380 may be formed to have a step. One or more step of the light filtering layer 380 may be formed in a separation space respectively formed between the first color conversion layer 330R and the second color conversion layer 330G adjacent to each other, between the first color conversion layer 330R and the transmission layer 330B adjacent to each other, and between the second color conversion layer 330G and the transmission layer 330B adjacent to each other. Here, the light filtering layer 380 may be formed by repeatedly depositing the layers having the different refractive indexes from each other through a process method such as a chemical vapor deposition method on an entire surface of the substrate including the color conversion and transmission layers. Since the light filtering layer 380 is also formed in the above-described separation space, a phenomenon that the light filtering layer 380 is lifted may be generated. In this way, if the phenomenon that the light filtering layer 380 is lifted is generated, the gas may be emitted through the lifted portion of the light filtering layer 380.

However, in an exemplary embodiment of manufacturing the color conversion panel, if the light filtering layer 380 is deposited after the first light blocking member 335 or the planarization layer 350 functioning as a planarization member is formed, the light filtering layer 380 may be formed to be substantially flat without the step described above.

Accordingly, a degree of the gas being emitted from the layer formed of the organic material like the first and second color conversion layers 330R and 330G, and the transmission layer 330B, may be reduced.

The contents described in FIG. 1 except for the above-described differences may all be applied to the exemplary embodiment of FIG. 4.

Figure 5:
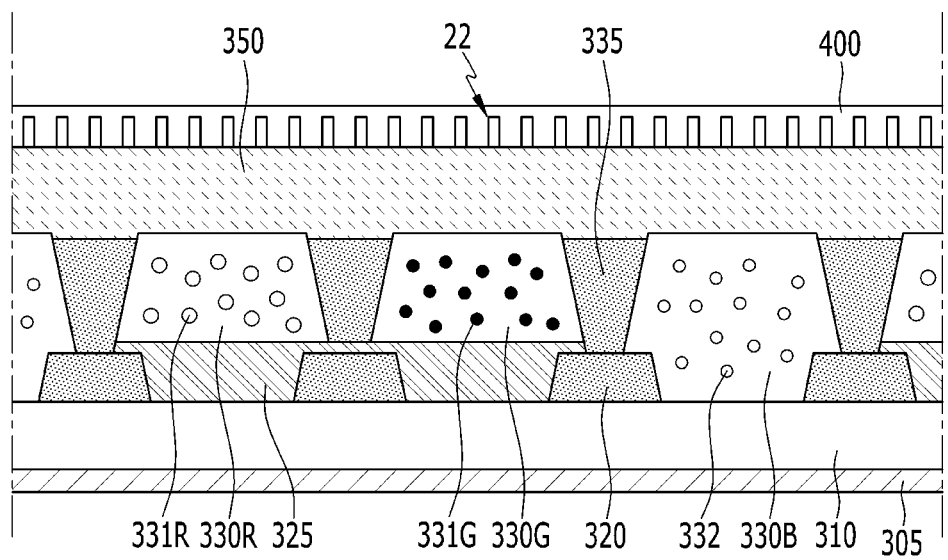
FIG. 5 is a cross-sectional view showing yet another exemplary variation of the color conversion panel described in FIG. 1.

FIG. 5 is a cross-sectional view showing yet another exemplary variation of the color conversion panel described in FIG. 1.

Referring to FIG. 5, in the present exemplary embodiment, a blue blocking filter 325 may be disposed between the first color conversion layer 330R and the substrate 310 and between the second color conversion layer 330G and the substrate 310.

The blue blocking filter 325 may block or absorb the blue light incident to the color conversion panel in the direction opposite to the first direction D1 from the light assembly (not shown). Without the blue blocking filter 325, blue light incident to the first color conversion layer 330R and the second color conversion layer 330G from the light assembly as a light source of a display device is changed into the red light or the green light by the quantum dots, while some blue incident light is not converted and may be emitted through the substrate 310. Accordingly, the blue blocking filter 325 may reduce or effectively prevent the red light or green light generated in the color conversion layers, and the blue light generated in the light assembly, from being mixed.

Also, the blue blocking filter 325 may block the external light incident to the color conversion panel in the first direction D1.

The contents described in FIG. 1 except for the above-described differences may all be applied to the exemplary embodiment of FIG. 5.

Figure 6:
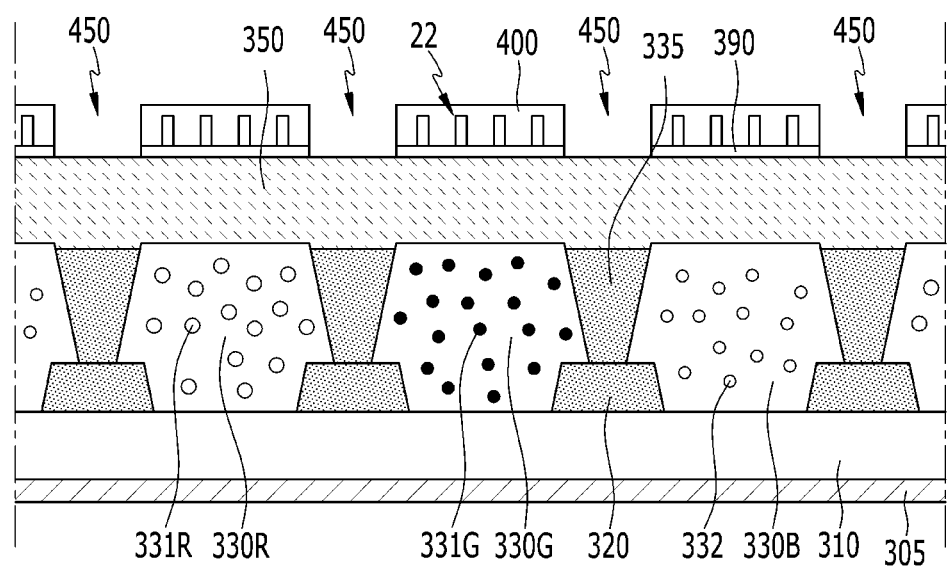
FIG. 6 is a cross-sectional view showing yet another exemplary variation of the color conversion panel described in FIG. 1.

FIG. 6 is a cross-sectional view showing yet another exemplary variation of the color conversion panel described in FIG. 1.

Referring to FIG. 6, an outlet 450 penetrating the polarization layer which is disposed on the planarization layer 350 is provided. The outlet 450 exposes portions of the planarization layer 350. The outlet 450 separates portions of the polarization layer from each other to expose portions of the underlying planarization layer 350. The outlet 450 functions to allow gas generated from the first and second color conversion layers 330R and 330G and from the transmission layer 330B to escape to outside the color conversion panel. The outlet 450 may overlap the first light blocking member 335 and the second light blocking member 320 in the direction substantially perpendicular to the substrate 310 (e.g., a thickness direction).

While the outlet 450 is described to overlap the collective light blocking member 335 and 325 included in the color conversion panel, the invention is not limited thereto. Alternatively, the outlet 450 may be disposed at a position overlapping a light blocking member (not shown) of a display panel of a display device when the color conversion panel is included in such display panel along with the display panel. Further, the light blocking member (not shown) formed in the display panel may overlap a gate line, a data line and a thin film transistor thereof.

In an exemplary embodiment of manufacturing the color conversion panel, the outlet 450 may be formed by a method such as a dry etching. As the outlet 450 is formed to overlap the light blocking member of the color conversion panel, even though a later-described common electrode is formed within the outlet 450, there is no problem in electric field formation in the display device including the color conversion panel formed according to the present exemplary embodiment.

The outlet 450 may be formed in plural. In exemplary embodiments, at least one outlet 450 may be formed for each pixel area of the display panel or display device, or the outlet 450 may be formed in any one region selected among a red pixel area (R in FIG. 8), a green pixel area (G in FIG. 8) and a blue pixel area (B in FIG. 8) of the display panel or display device.

Although not shown, the common electrode of a display panel or display device is disposed on the polarization pattern 22 which configures the polarization layer and on the insulating layer 400. The common electrode may extend to commonly cover the upper surface of the insulating layer 400 and the exposed portions of the planarization layer 350 at the outlet 450.

In an exemplary embodiment of manufacturing the color conversion panel, as the outlet 450 is formed prior to forming the common electrode, the gas may be discharged before the outlet 450 is covered by the common electrode. The gas discharge may naturally occur between processes of forming the outlet 450 and the process of forming the common electrode.

In an exemplary embodiment of manufacturing the color conversion panel, if the gas is not discharged but remains within a structure of the color conversion panel, when forming other element of a display device such as an optical control layer (e.g., a liquid crystal layer) after forming the color conversion panel, the gas fills the space at which liquid crystal material is to be disposed such that the liquid crystal material is leaked at a portion a display area of the display device, thereby causing light leakage.

A passivation layer 390 may be disposed between the planarization layer 350 and the polarization layer. The passivation layer 390 may be a silicon nitride layer and may serve as an etching preventing layer.

The contents described in FIG. 1 except for the above-described differences may all be applied to the exemplary embodiment of FIG. 6.

Figure 7:
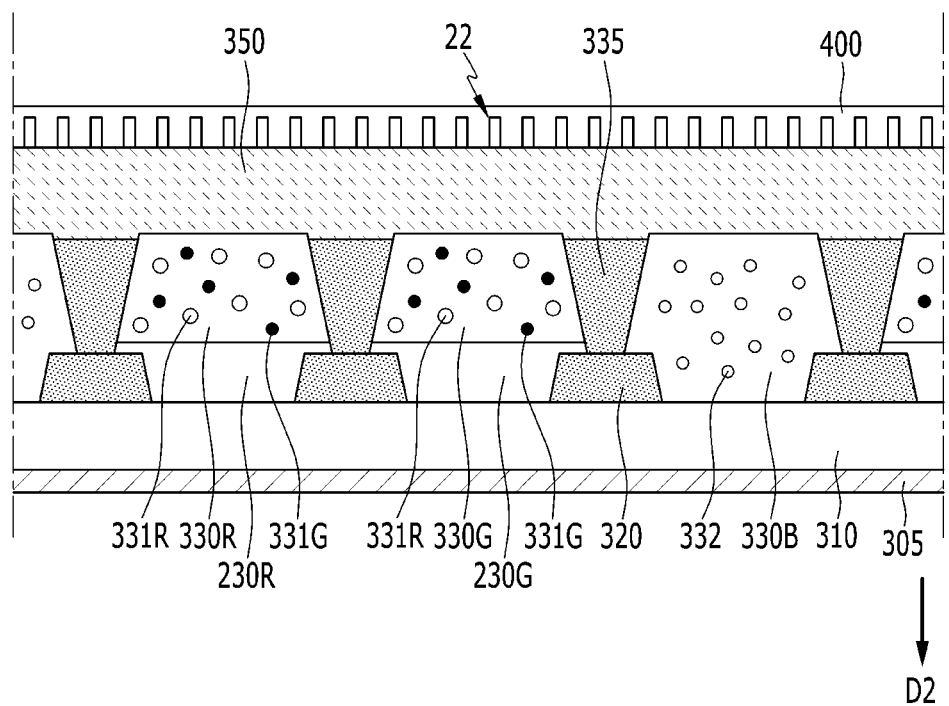
FIG. 7 is a cross-sectional view showing yet another exemplary variation of the color conversion panel described in FIG. 1.

FIG. 7 is a cross-sectional view showing yet another exemplary variation of the color conversion panel described in FIG. 1.

Referring to FIG. 7, the color conversion panel includes a first color filter 230R disposed between the substrate 310 and the first color conversion layer 330R and a second color filter 230G disposed between the substrate 310 and the second color conversion layer 330G. The first color filter 230R may be a red color filter, and the second color filter 230G may be a green color filter.

In the present exemplary embodiment, the first color conversion layer 330R and the second color conversion layer 330G each respectively include at least two quantum dots representing different colors. In an exemplary embodiment, for example, the first color conversion layer 330R may include a red quantum dot 331R and a green quantum dot 331G. Accordingly, the blue light from the light assembly (not shown) as a light source of a display device and incident to the first color conversion layer 330R along the second direction D2 (which is opposite to the first direction D1 along the thickness of the color conversion panel) is changed into the red light and the green light by the red quantum dot 331R and the green quantum dot 331G and is emitted from the first color conversion layer 330R.

As the second color conversion layer 330G includes the red quantum dots 331R and the green quantum dots 331G like the first color conversion layer 330R, the blue light incident to the second color conversion layer 330G is converted into the red light and the green light by the red quantum dots 331R and the green quantum dots 331G to be emitted from the second color conversion layer 330G.

In the present exemplary embodiment, as both of the first color conversion layer 330R and the second color conversion layer 330G include the red quantum dots 331R and the green quantum dots 331G, the light respectively incident to the first color conversion layer 330R and the second color conversion layer 330G may represent the same color when being emitted from the first color conversion layer 330R and the second color conversion layer 330G. Accordingly, to represent different colors from each other for each region where the first color conversion layer 330R and the second color conversion layer 330G are disposed, and for this function, the first color filter 230R and the second color filter 230G are disposed between the substrate 310 and the first color conversion layer 330R and between the substrate 310 and the second color conversion layer 330G The contents described in FIG. 1 except for the above-described differences may all be applied to the exemplary embodiment of FIG. 7.

Each of the exemplary embodiments of FIG. 2 to FIG. 7 describes exemplary variations of the color conversion panel described in FIG. 1, however is not limited thereto. Features from the exemplary embodiment among those FIG. 2 to FIG. 7 may be combined with each other.

A display device including one or more exemplary embodiment the above-described color conversion panel may be manufactured by forming a display panel which displays an image with light and includes a switching element such as a thin film transistor and forming an optical (transmittance) control layer such as a liquid crystal layer between the display panel and the color conversion panel. The liquid crystal layer may be formed between the display panel and the color conversion panel after overlapping the display panel and the color conversion panel, as an example.

Figure 8:
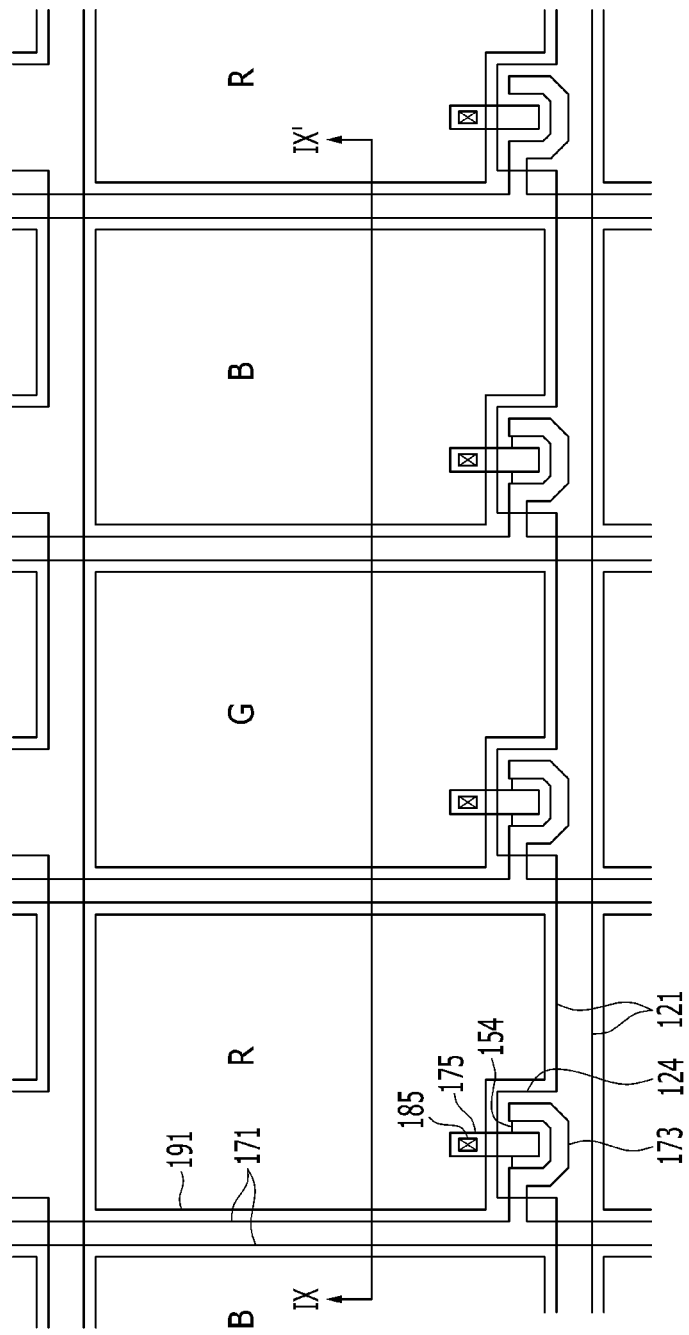
FIG. 8 is a top plan view showing a display device according to an exemplary embodiment of the present disclosure.
Figure 9:
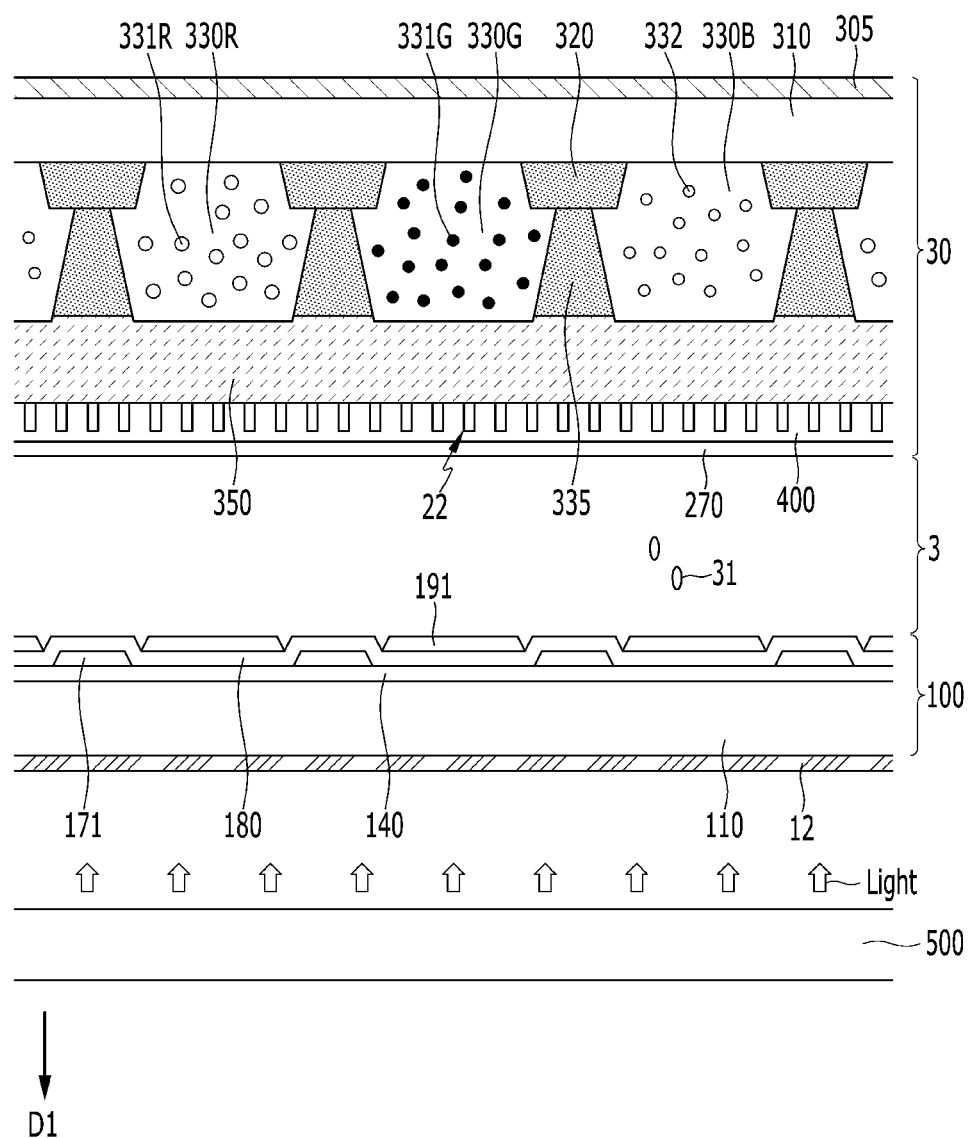
FIG. 9 is a cross-sectional view taken along line IX-IX' of FIG. 8.

FIG. 8 is a top plan view showing a display device according to an exemplary embodiment of the present disclosure. FIG. 9 is a cross-sectional view taken along line IX-IX' of FIG. 8.

Referring to FIG. 8 and FIG. 9, the display device includes a light assembly 500, a display panel 100 which displays an image with light, a color conversion panel 30, and optical (transmittance) control layer such as a liquid crystal layer 3. A light assembly 500 for generating and supplying the light which passes through, in order, the display panel 100, the liquid crystal layer 3 and the color conversion panel 30, may be disposed to be adjacent to the display panel 100. The liquid crystal layer 3 is disposed between the display panel 100 and the color conversion panel 30, and contains a liquid crystal material including a plurality of liquid crystal molecules 31. Controlling orientation of the liquid crystal molecules 31 controls transmittance of light through the liquid crystal layer 3 for generating and displaying the image by the display panel 100.

The light assembly 500 may include a light source generating the light. The light assembly 500 may further include a light guide (not shown) receiving the light generated from the light source and guiding the light in a direction in which the display panel 100 and the color conversion panel 30 are disposed relative to the light assembly 500.

As the light source, the light assembly 500 may include at least one light emitting diode ("LED"), and as one example. The light source may be a blue light emitting diode ("LED"). However, the light source may include a green light emitting diode ("LED"), a white light source, or an ultraviolet ray light source instead of the blue light emitting diode (LED). For convenience of explanation, in the present exemplary embodiment, only the display device using the light assembly 500 including the blue light emitting diode ("LED") will be described.

The display device according to the present exemplary embodiment further includes a first polarizer 12 disposed under the display panel 100. The first polarizer 12 may use the coating polarizer, the wire grid polarizer, etc. The first polarizer 12 linearly polarizes the light that is generated from the light assembly 500 and is not polarized to be incident to the liquid crystal layer 3. With the first polarizer 12, a polarization axis of the light incident to the liquid crystal layer 3 is rotated while being passing through the liquid crystal layer 3, and the polarization pattern 22 included in the color conversion panel 30 reflects only the polarization component parallel to the polarization pattern 22 and transmits the polarization component perpendicular to the polarization pattern 22 among the light emitted from the liquid crystal layer 3.

Next, the display panel 100 will be described in detail.

Referring to FIG. 8, the top plan view illustrated a plane defined by the third and fourth directions, while FIG. 9 illustrates a plane defined by the third or fourth direction, and the first and second (thickness) directions.

Referring to FIG. 8 and FIG. 9, the display panel 100 includes a gate line 121 having a length extending in a row direction (such as the third direction) on a first (base) substrate 110 and including or defining a gate electrode 124, a gate insulating layer 140 disposed on the gate line 121 and gate electrode 124, a semiconductor layer 154 disposed on the gate insulating layer 140, a data line 171 disposed on the semiconductor layer 154 and having a length extending in a column direction (such as the fourth direction), a source electrode 173 connected to the data line 171, a drain electrode 175 facing the source electrode 173, a passivation layer 180 disposed on the data line 171 and the drain electrode 175, and a pixel electrode 191 electrically connected to the drain electrode 175 at a contact hole 185 of the passivation layer 180 and formed in the passivation layer 180. One or more of these elements may be provided in plurality on the substrate 110. For convenience of explanation, detail elements shown in FIG. 8 are omitted in FIG. 9.

Pixel electrodes 191 are disposed in a matrix shape along the row and column directions in the top plan view. The shape and the arrangement of the pixel electrodes 191 may be changed. The pixel electrodes 191 may respectively correspond to a red pixel area (R), a green pixel area (G) and a blue pixel area (B).

Multiple pixel electrodes 191 are disposed or formed for each pixel area of the display panel 100 or display device. The semiconductor layer 154 disposed on the gate electrode 124 forms a channel layer of a switching element and is disposed between the source electrode 173 and the drain electrode 175. The gate electrode 124, the semiconductor layer 154 forming the channel layer, the source electrode 173 and the drain electrode 175 may form a single one switching elements such as a thin film transistor.

The display panel 100 may include a light blocking member (not shown). The light blocking member (not shown) overlaps the thin film transistor and may be formed to disposed at regions at which the gate line 121 and the data line 171 are disposed.

Next, the color conversion panel 30 will be described.

The color conversion panel 30 overlapping the above-described display panel 100 may be the color conversion panel described in FIG. 1, as including any one or combination of elements described in FIG. 2 to FIG. 7. For convenience of explanation, a structure of the color conversion panel described in FIG. 1 is shown in FIG. 9.

The color conversion panel oriented in FIG. 1 may be disposed on the display panel 100 in an inverted state to position the substrate 310 of the color conversion panel 30 furthest away from an uppermost portion of the display panel 100. A common electrode 270 is disposed on the liquid crystal layer 3, and the polarization layer corresponding to a second polarizer of the display device is disposed on the common electrode 270, thereby forming an in-cell polarizer structure. The polarization layer, as above-described, may collectively include the polarization pattern 22 including the metal material and the insulating layer 400. If the in-cell polarizer is formed, the light path may be advantageously reduced. The common electrode 270 may be disposed or formed in the color conversion panel 30, as illustrated in FIG. 9.

Although not shown, an alignment layer may be formed between the liquid crystal layer 3 and the pixel electrode 191 and between the liquid crystal layer 3 and the common electrode 270. The first polarizer 12 disposed under the display panel 100 and the second polarizer 22 together with 400 included in the conversion panel 30 may polarize the light incident from the light assembly 500.

The common electrode 270 to which is applied a common voltage forms an electric field along with the pixel electrode 191 such that each long axis of the liquid crystal molecules 31 disposed in the liquid crystal layer 3 is inclined in a direction perpendicular or parallel to the electric field to orient the liquid crystal molecules 31. The degree of the polarization of the light that is incident to the liquid crystal layer 3 is changed depending on the inclination degree of the liquid crystal molecules 31, and this change of polarization appears as a change of transmittance by the polarizer such that the display device such as the liquid crystal display displays an image.

Alternatively, the common electrode 270 is not limited to being disposed or formed in the color conversion panel 30. In an exemplary embodiment, the electric field may be formed by the common electrode 270 together the pixel electrode 191, via the insulating layer within the display panel 100.

The contents related to the color conversion panels described in FIG. 1 to FIG. 7 may all be applied to the present exemplary embodiment.

The above-described display device may provide improved color reproducibility and contrast ratio through the color conversion panel. Also, an upper (display) panel overlapping the display panel (100 in FIG. 9) functioning as the lower (display) panel is not separately formed, and the color conversion panel 30 may be substituted for the upper (display) panel within the display device. Accordingly, the display device according to the present exemplary embodiment provides a device of a relatively smaller thickness and with merits of reducing the overall cost and the weight thereof.

Figure 10:
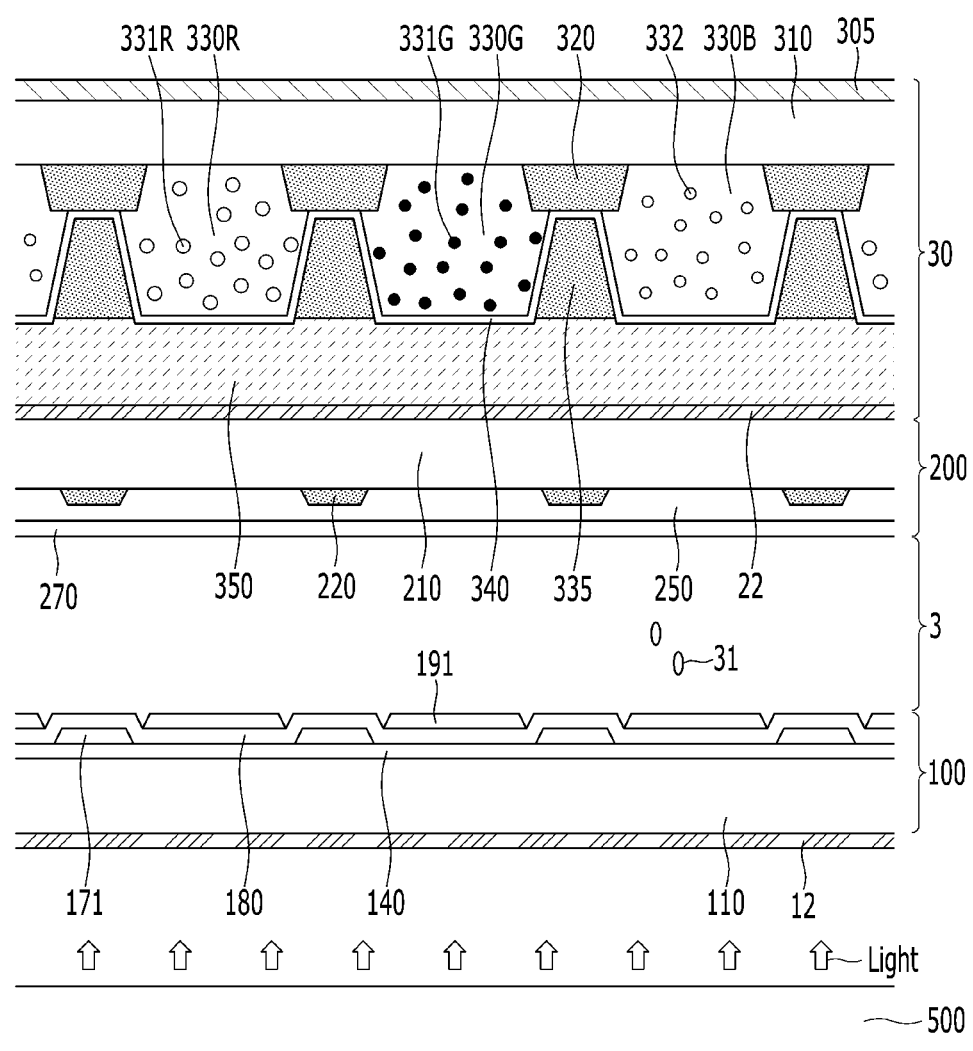
FIG. 10 is a cross-sectional view showing an exemplary variation of the display device described in FIG. 9.

FIG. 10 is a cross-sectional view showing an exemplary variation of the display device described in FIG. 9.

Referring to FIG. 10, the display panel 100 in FIG. 9 configures a lower (display) panel of the display device, and an upper (display) panel 200 overlaps the lower panel 100. The liquid crystal layer 3 including the plurality of liquid crystal molecules 31 is disposed between the lower panel 100 and the upper panel 200. The collection of the liquid crystal layer 3, the lower panel 100 and the upper panel 200 may be considered a display panel of the display device in FIG. 10.

The upper panel 200 includes a second substrate 210 overlapping and separated from the first substrate 110. A black matrix 220 as a light blocking member, an overcoat 250 and a common electrode 270 of the upper panel 200 are disposed between the second substrate 210 and the liquid crystal layer 3. In detail, the black matrix 220 is disposed between the second substrate 210 and the overcoat 250. The overcoat 250 is disposed between the liquid crystal layer 3 and the second substrate 210 while covering the black matrix 220. The common electrode 270 is disposed between the liquid crystal layer 3 and the overcoat 250.

Although not shown, an alignment layer may be formed between the liquid crystal layer 3 and the pixel electrode 191 and between the liquid crystal layer 3 and the common electrode 270.

The color conversion panel according to one or more exemplary embodiment of the invention is applied to the liquid crystal display as a display device in the above-described embodiments, however, is not limited thereto. One or more exemplary embodiment of the color conversion panel according to the invention may also be applied to an organic light emitting diode display as a display device.

When being applied to the organic light emitting diode display, a light (generating) emission layer thereof may emit the blue or white light such as to be incident light, and the red light, the green light and the blue light may be emitted through the color conversion panel.

Also, the present disclosure may be applied to an emissive display device (micro-LED) having a structure in which a plurality of light emitting diodes ("LED") are formed on the substrate. However, for such an emissive display device, the polarization layer disposed between the color conversion panel and the display panel may be omitted.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A color conversion panel comprising:
   a mirror function relative to light incident to the color conversion panel, the mirror function provided by a reflective polarization film;
   a color conversion layer which faces the reflective polarization film and color converts light incident to the color conversion layer;
   a light blocking member comprising:
      a first light blocking member adjacent to the color conversion layer; and
      a second light blocking member which overlaps the first light blocking member with a separation space therebetween and is closer to the reflective polarization film than the first light blocking member; and
   an overlayer which extends between the first light blocking member and the second light blocking member at the separation space therebetween,
   wherein the color conversion layer has a greatest width at an interface between the overlayer and the light blocking member.

2. The color conversion panel of claim 1, further comprising a polarization layer, the polarization layer comprising:
   a polarization pattern including a metal material, and
   an insulating layer which covers the polarization pattern.

3. The color conversion panel of claim 2, wherein the color conversion layer includes:
   a first color conversion layer and a second color conversion layer spaced apart from each other along the reflective polarization film,
   the first light blocking member disposed between the first color conversion layer and the second color conversion layer spaced apart from each other, and
   a width of the first light blocking member in a cross-section thereof gradually increasing along a direction from the reflective polarization film toward the color conversion layer.

4. The color conversion panel of claim 3, further comprising a substrate between the color conversion layer and the reflective polarization film.

5. The color conversion panel of claim 4, further comprising a planarization layer disposed between the polarization layer and the first light blocking member,
   wherein
   a first thickness of the planarization layer is defined at the first color conversion layer or the second color conversion layer, and a second thickness of the planarization layer is defined at the first light blocking member,
   the first and second thickness are the same as each other or the second thickness is larger than the first thickness, and
   the second thickness being larger than the first thickness defines a difference between the second thickness and the first thickness smaller than about 1 micrometer.

6. The color conversion panel of claim 4, wherein a width of the second light blocking member in a cross-section thereof gradually decreases in the direction from the reflective polarization film toward the color conversion layer.

7. The color conversion panel of claim 3, wherein
   the overlayer comprises a capping layer extending from between the first light blocking member and the second light blocking member, along the first light blocking member in a direction away from the second light blocking member, and between the first color conversion layer and the first light blocking member and between the second color conversion layer and the first light blocking member.

8. The color conversion panel of claim 7, wherein the overlayer further comprises a light filter layer disposed between the capping layer and the planarization layer.

9. The color conversion panel of claim 3, further comprising:
   a planarization layer disposed between the polarization layer and the first light blocking member, and
   an outlet which penetrates the polarization layer, the outlet exposing the planarization layer to outside the polarization layer.

10. The color conversion panel of claim 3, wherein the first color conversion layer and the second color conversion layer comprise at least two light color conversion members representing different colors from each other, respectively,
    further comprising, with the first and second color conversion layers each comprising the at least two light color conversion members:
       a first color filter disposed between the reflective polarization film and the first color conversion layer; and
       a second color filter disposed between the reflective polarization film and the second color conversion layer.

11. The color conversion panel of claim 3, further comprising a transmission layer adjacent to the first and second color conversion layers along the reflective polarization film.

12. The color conversion panel of claim 1, wherein the reflective polarization film is a dual brightness enhancement film.

13. The color conversion panel of claim 1, wherein
    the second light blocking member comprises an organic layer, and
    the overlayer comprises a transflective layer extending from between the first light blocking member and the second light blocking member and along the second light blocking member in a direction away from the first light blocking member.

14. A display device comprising:
    a color conversion panel comprising:
       a mirror function relative to light incident to the color conversion panel, the mirror function of the color conversion panel being provided by a reflective polarization film,
       a color conversion layer which faces the reflective polarization film and color converts light of a displayed image incident to the color conversion layer,
       a light blocking member which is adjacent to the color conversion layer and extending along a thickness of the color conversion layer, the light blocking member including a first light blocking member and a second light blocking member which overlaps the first light blocking member and is closer to the reflective polarization film than the first light blocking member, the color conversion layer having a greatest width at an interface between the first light blocking member and the second light blocking member, and a color filter which extends between the first light blocking member and the second light blocking member, from the interface therebetween.

15. The display device of claim 14, wherein the color conversion layer includes a first color conversion layer, a second color conversion layer and a transmission layer spaced apart from each other along the reflective polarization film, the light blocking member is provided in plural between the first color conversion layer, the second color conversation layer and the transmission layer which are respectively adjacent to each other, and a width of each of the first color conversion layer, the second color conversion layer and the transmission layer is greatest at the interface between the first light blocking member and the second light blocking member of a respective light blocking member among the light blocking members.

16. The display device of claim 14, further comprising a polarization layer, the polarization layer comprising:

a polarization pattern including a metal material, and an insulating layer which covers the polarization pattern.

17. The display device of claim 14, wherein the reflective polarization film is a dual brightness enhancement film.

18. The display device of claim 14, further comprising a light source unit which provides the light of the displayed image.

19. The display device of claim 14, wherein the first light blocking member has a width which increases in the direction from the reflective polarization film to the color conversion layer.

20. The display device of claim 19, further comprising:

a polarization layer, and a planarization layer disposed between the polarization layer and the first light blocking member, wherein a first thickness of the planarization layer is defined at the color conversion layer, and a second thickness of the planarization layer is defined at the first light blocking member, the first and second thicknesses are the same as each other or the second thickness is larger than the first thickness, and the second thickness being larger than the first thickness defines a difference between the second thickness and the first thickness smaller than about 1 micrometer.

21. The display device of claim 19, wherein the second light blocking member has a width which decreases in the direction from the reflective polarization film to the color conversion layer.

22. The display device of claim 14, wherein the color conversion panel further comprises a substrate between the color conversion layer and the reflective polarization film.

23. The display device of claim 14, wherein the color filter overlaps the color conversion layer and is coplanar with the second light blocking member.

24. The display device of claim 23, wherein the color conversion layer includes a first color conversion layer, a second color conversion layer and a transmission layer spaced apart from each other along the reflective polarization film, and the color filter layer overlaps both the first color conversion layer and the second color conversion layer and is spaced apart from the transmission layer.

25. The display device of claim 24, wherein the light blocking member is provided in plural respectively between the first color conversion layer, the second color conversion layer and the transmission layer which are respectively adjacent to each other, and the color filter extends from the interface of the light blocking member which is between the transmission layer and the first color conversion layer, to between the first light blocking member and the second light blocking member of the light blocking member which is between the first color conversion layer and the second color conversion layer.

26. The display device of claim 25, wherein the color filter further extends from the light blocking member which is between the first color conversion layer and the second color conversion layer, to the interface of the light blocking member which is between the second light blocking member and the transmission layer.

27. The display device of claim 24, wherein the light blocking member is provided in plural respectively between the first color conversion layer, the second color conversion layer and the transmission layer which are respectively adjacent to each other, and the color filter includes:

a first color filter overlapping the first color conversion layer, and a second color filter overlapping the second color conversion layer and spaced apart from the first color filter by a respective light blocking member between the first color conversion layer and the second color conversion layer.

* * * * *